United States Patent [19]

Mannou et al.

[11] Patent Number: 5,270,246
[45] Date of Patent: Dec. 14, 1993

[54] MANUFACTURING METHOD OF SEMICONDUCTOR MULTI-LAYER FILM AND SEMICONDUCTOR LASER

[75] Inventors: Masaya Mannou; Kiyoshi Onaka, both of Osaka, Japan

[73] Assignee: Matsushita Electric Industrial Co., Ltd., Osaka, Japan

[21] Appl. No.: 901,765

[22] Filed: Jun. 17, 1992

[30] Foreign Application Priority Data

Jun. 18, 1991 [JP] Japan .................. 3-146230

[51] Int. Cl.⁵ ............................................. H01L 21/20
[52] U.S. Cl. ....................................... 437/129; 437/151
[58] Field of Search .................. 437/129, 151, 30, 126; 148/DIG. 151

[56] References Cited

U.S. PATENT DOCUMENTS 4,131,904 12/1978 Lidany et al. .................. 437/151
4,889,830 12/1989 Springthorpe et al. ......... 437/151
4,980,313 12/1990 Takahashi ....................... 437/129

OTHER PUBLICATIONS

T. Kawabata et al in "Metalorganic chemical vapor deposition of InGaAsP/InP layers and fabrication of 1.3μ planar Buried Heterostructure lasers" in J. Appl. Phys. 64 (1988), pp. 3684–3688.

*Primary Examiner*—Robert Kunemund
*Assistant Examiner*—Ramamohan Rao Paladugu
*Attorney, Agent, or Firm*—Willian Brinks Olds Hofer Gilson & Lione

[57] ABSTRACT

When an n-type semiconductor layer is formed on a p-type semiconductor layer in a device such as a semiconductor multi-layer film, the n-type semiconductor layer is formed by adding a p-type dopant as well as an n-type dopant simultaneously. In a double heterostructure semiconductor laser including an AlGaInP active layer and AlGaInP cladding layers, when an n-type current blocking layer is formed on the p-type cladding layer, the n-type current blocking layer is formed by adding a p-type dopant as well as an n-type dopant simultaneously.

13 Claims, 4 Drawing Sheets

MANUFACTURING METHOD OF SEMICONDUCTOR MULTI-LAYER FILM AND SEMICONDUCTOR LASER

BACKGROUND OF THE INVENTION

1. Field of the Invention

The present invention relates to a manufacturing method of a semiconductor multi-layer film and of a semiconductor laser.

2. Description of the Prior Art

Recently, a visible semiconductor laser of 600 nm band of AlGaInP system has been developed actively for a light source for an information processing apparatus such as a laser printer or an optical disk drive.

A prior art semiconductor laser of transverse mode control type is manufactured by using an epitaxial growth process including at least twice epitaxial growth steps with a metal-organic vapor phase epitaxial growth technique (MOVPE). FIG. 1 shows an example of a structure of a transverse-mode stabilized AlGaInP semiconductor laser. This semiconductor laser is manufactured as follows: In the first epitaxial growth step, a n-AlGaInP cladding layer 2, a GaInP active layer 3, a p-AlGaInP first cladding layer 4 and an n-AlInP current blocking layer 5 are layered on an n-GaAs substrate 1 successively. Next, a stripe-like groove is formed in the current blocking layer 5 by etching until the first cladding layer 4 is exposed. Then, in the second epitaxial growth step, a p-AlGaInP second cladding layer 6 and a p-GaAs contact layer 7 are layered successively over the groove. Next, electrodes 12 and 13 are formed at both sides.

In this manufacturing method, it is a problem that the repetition of the temperature increase and the regrowth on the AlGaInP layer causes the self-diffusion of doped impurities. For example, when selenium is doped in the n-AlInP current blocking layer 5 of the order of $n=2 \times 10^{18}$ cm$^{-3}$, selenium atoms diffuse in the direction of the GaInP active layer 3, and this also enhances the diffusion of zinc of the dopant in the p-AlGaInP first cladding layer 4. Therefore, the carrier density profile in each layer changes in the regrowth and the position of the pn junction is not reproducible. Further, the diffusion of zinc into the GaInP active layer 3 causes the disordering of the crystal structure of GaInP and this makes the oscillation frequency unstable. A similar phenomenon may arise when the doping amount of the selenium is lower than that in the abovementioned case.

This phenomenon is a problem on the improvement of the characteristics of AlGaInP semiconductor laser and the increase in the yield thereof. This is also a problem in general on forming an n-type layer on a p-type layer in a semiconductor multi-layer film with the desired carrier profile reproducibly.

SUMMARY OF THE INVENTION

An object of the present invention is to provide a manufacturing method of a semiconductor multi-layer film having an n-type semiconductor layer without affecting an adjacent p-type semiconductor layer.

Another object of the present invention is to provide a manufacturing method of an AlGaInP semiconductor laser which can suppress the diffusion of dopants in the AlGaInP layer to improve the characteristics of the semiconductor laser and to increase the yield thereof.

In a manufacturing method of a semiconductor multi-layer including a p-type semiconductor layer and an n-type semiconductor layer applied to the p-type semiconductor layer such as a p-AlGaInP layer, after a p-type semiconductor layer such as a p-AlGaInP layer by doping a p-type dopant, an n-type semiconductor layer is formed on the p-type semiconductor layer by doping an n-type dopant and the p-type dopant simultaneously.

An advantage of the present invention is that the simultaneous addition of the n-type and p-type dopants on forming an n-type semiconductor layer suppresses the self-diffusion of the n-type dopant so as to realize the desired concentration profiles of the n-type semiconductor layer and of an adjacent layer.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

Figure 1:
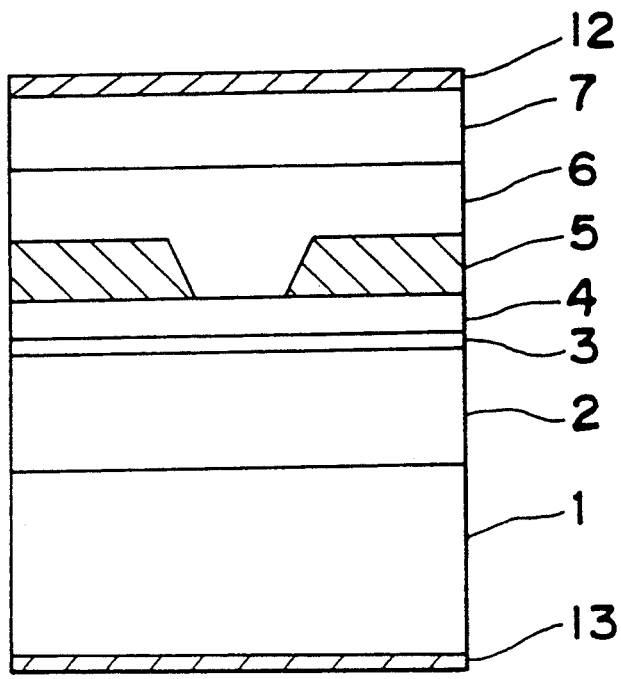
FIG. 1 is a schematic sectional view of a transverse-mode stabilized AlGaInP semiconductor laser.
Figure 2:
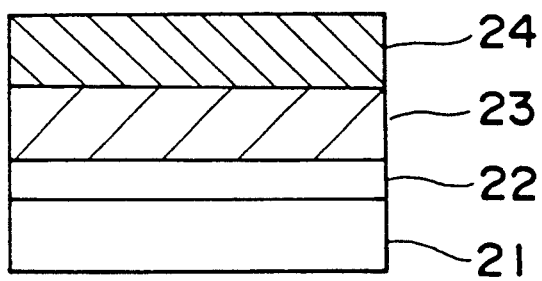
FIG. 2 is a schematic sectional view of a semiconductor multi-layer film.

Referring now to the drawings, wherein like reference characters designate like or corresponding parts throughout the several views, a manufacturing method of a semiconductor multi-layer film shown in FIG. 2 is explained first. The semiconductor multi-layer film is manufactured as follows: In the first epitaxial growth step with use of the metal-organic vapor phase epitaxial growth technique (MOVPE), an n-type GaAs layer 22 of thickness 0.5 µm, a p-type AlGaInP layer 23 of thickness of 0.2 µm and an n-type AlGaInP layer 24 of thickness 0.5 µm are layered successively on an n-GaAs substrate 21 at 700° C. of growth temperature. Selenium hydride (H$_2$Se) is used as the n-type dopant gas and dimethyl zinc (DMZ) is used as the p-type dopant gas, and they are used at the desired carrier concentrations. When the n-AlGaInP layer 24 is grown, both H$_2$Se and dimethyl zinc are supplied at the same time, so that the carrier density in the n-AlGaInP layer 24 becomes $10^{18}$ cm$^{-3}$.

Figure 3A:
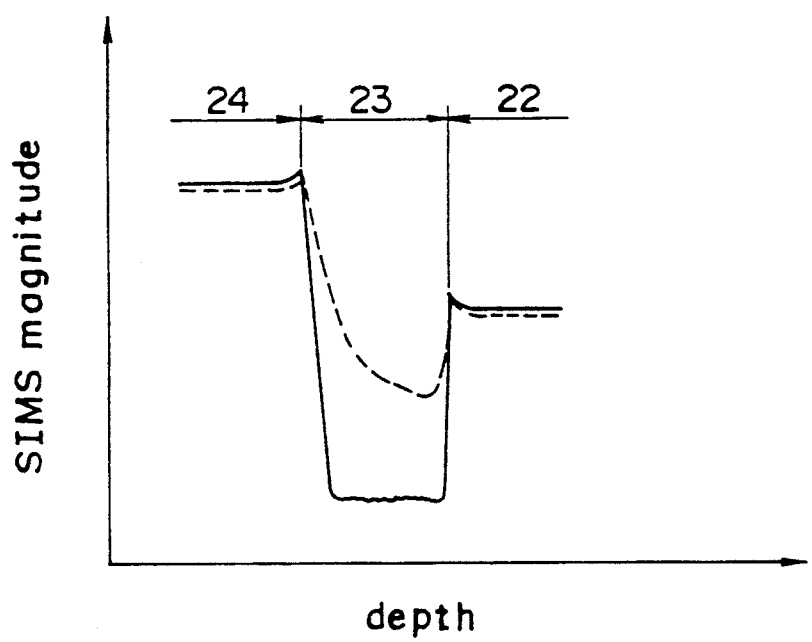
FIG. 3(a) is a graph of Se concentration profile in a semiconductor multi-layer film.

FIGS. 3(a) and (b) show the selenium and zinc density profiles, as solid lines, measured by using the secondary ionic mass spectroscopy method (SIMS) of a semiconductor multi-layer film manufactured as explained above, respectively. The dashed lines in FIGS. 3(a) and (b) express the results of a multi-layer film manufactured for comparison by supplying only H$_2$Se when the n-AlGaInP layer 24 is grown.

Figure 3B:
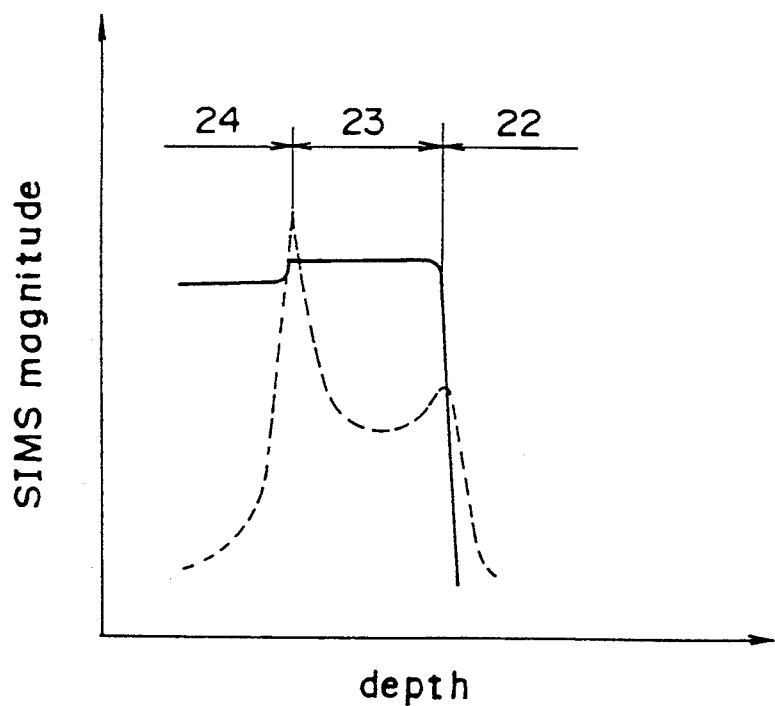
FIG. 3(b) is a graph of Zn concentration profile in a semiconductor multi-layer film.

As shown by the dashed lines, if only H$_2$Se is supplied on growing the n-AlGaInP layer 24, selenium atoms are diffused into the p-AlGaInP layer 23 (FIG. 3(a)), and that zinc atoms pile up at the two interfaces of the p-AlGaInP layer 23 (FIG. 3(b)).

On the contrary, both H$_2$Se and dimethyl zinc are added at the same time, such diffusion phenomenon is not observed as displayed by the solid lines in FIGS. 3(a) and (b). That is, selenium atoms in the n-AlGaInP layer 24 do not diffuse into the p-AlGaInP layer 23, while the concentration of zinc in the p-AlGaInP layer 23 is not affected. That is, a semiconductor multi-layer film can be manufactured reproducibly without disturbing the carrier concentration profiles of the p-AlGaInP layer 23 and of the adjacent layers 22 and 24, by doping zinc as well as selenium at the same time during the growth of the n-AlGaInP layer 24.

The diffusion coefficient of selenium is said generally to be small for example in GaAs. However, when selenium is doped at a high concentration, selenium atoms diffuse into the solid phase of GaAs during crystal growth. A similar phenomenon also appears in the AlGaInP system, and when selenium is doped, anomalous solid phase diffusion of selenium arises at a relatively low concentration of carrier concentration (n>2−3×10$^{18}$ cm$^{−3}$). The diffusion of selenium is thought to be related to selenium atoms at interstitial sites. As shown in the above-mentioned embodiment, when zinc is doped at the same time as selenium, the anomalous solid phase diffusion of selenium can be suppressed largely.

Figure 4A:
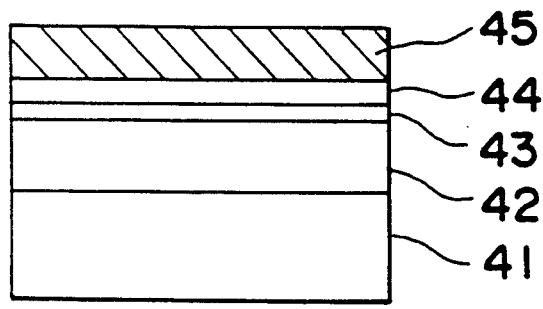
FIGS. 4(a), (b) and (c) are schematic sectional views for explaining of a manufacturing method of a transverse-mode stabilized semiconductor laser.
Figure 4B:
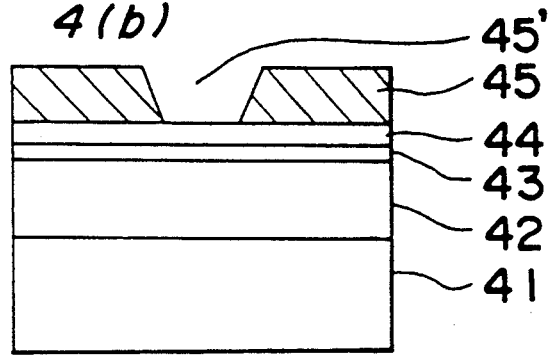
Figure 4C:
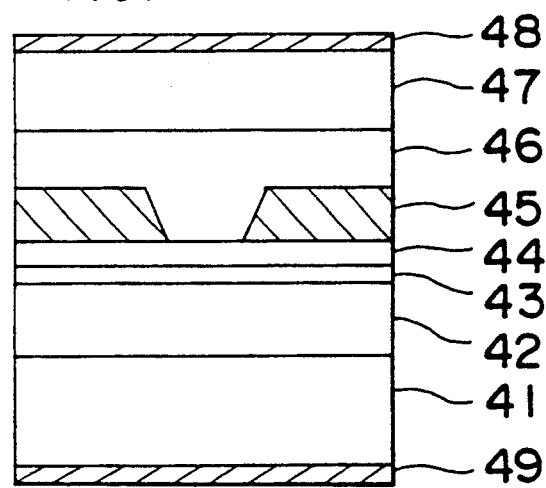

Next, a manufacturing method of a semiconductor laser is explained. FIGS. 4(a)-(c) display the processes of manufacturing a transverse mode stabilized semiconductor laser.

As shown in FIG. 4(a), in the first MOVPE growth, an n-Al$_{0.35}$Ga$_{0.15}$In$_{0.5}$P cladding layer 42 of thickness 1 μm, a GaInP active layer 43 of thickness 0.06 μm, a pA10 Al$_{0.35}$Ga$_{0.15}$In$_{0.5}$P first cladding layer 44 of thickness 0.3 μm and an n-AlInP current blocking layer 45 of thickness 0.5 μm are formed on a GaAs substrate 41 successively. The MOVPE growth is performed under a reduced pressure of 100 Torr at a growth temperature of 700° C. Selenium hydride (H$_2$Se) is used as the n-type dopant gas and dimethyl zinc is used as the p-type dopant gas, and the carrier concentrations of selenium hydride and of dimethyl zinc are set to be 5×10$^{17}$ cm$^{−3}$ and 2×10$^{18}$ cm$^{−3}$. When the n-AlInP layer 45 is grown, both H$_2$Se and dimethyl zinc are supplied at the same time, so that the carrier density in the n-AlInP layer 45 becomes 10$^{18}$ cm$^{−3}$.

Next, as shown in FIG. 4(b), a stripe-like groove 45' is formed in the current blocking layer 45 by etching it to expose the first cladding layer 44. Then, as shown in FIG. 4(c), in the second MOVPE growth, a p-AlGaInP second cladding layer 46 of thickness 0.3 μm and a p-GaAs contact layer 47 of thickness 3 μm are layered successively over the whole surface to fill the groove. The growth conditions in the second MOVPE growth are the same as those in the first MOVPE growth. Finally, electrodes 48 and 49 are formed at the p side and at the n side, respectively.

A semiconductor laser manufactured as explained above has the characteristic temperature of 120 K which is higher than 75 K of a comparison example which is manufactured without the same supply of dimethyl zinc. The oscillation wavelength is 680 nm which is higher than 668 nm of the comparison example, and this means that the disordering in the GaInP active layer 43 does not occur.

In this embodiment, the n-AlInP current blocking layer 45 is grown by supplying the p-type dopant (DMZ) as well as the n-type dopant (H$_2$Se) simultaneously. Thus, the carrier concentration in the p-AlGaInP first cladding layer 44 is not changed and the position of the pn junction does not move. Further, the diffusion of zinc of the p-type dopant from the cladding layer to the active layer 43 is not accelerated and the disordering of the GaInP active layer 43 does not occur. Therefore, this method is advantageous for improving the characteristics and the reproducibility of semiconductor laser.

In this embodiment, GaInP is used for the active layer 43 and AlGaInP is used for the cladding layer 44. However, other compositions may also be used for the layers. For example, the active layer 43 may be made of Al$_x$Ga$_{1-x-y}$In$_y$P, or GaAs and the cladding layer 44 may be made of Al$_{x'}$Ga$_{1-x'-y'}$In$_{y'}$P (x<x'). Further, the current blocking layer 45 is not limited to n-AlInP. For example, the current blocking layer 45 is made of Al$_{x''}$Ga$_{1-x''-y''}$In$_{y''}$P. Still further, the active layer 43 may have a quantum well structure, and each layer is also made of an AlGaInP superlattice. The n-type and p-type dopants are not limited to Se and Zn, respectively. The material gas is also not limited. For example, zinc can also be used to suppress the diffusion of silicon of n-type dopant. More generally, a p-type dopant such as zinc, magnesium or cadmium can be used to suppress the diffusion of an n-type dopant such as selenium, silicon, sulfur or tellurium.

In this embodiment, the simultaneous doping technique is applied to the current blocking layer 45. However, it can also be applied generally to an n-type semiconductor layer adjacent to a p-type semiconductor layer.

Figure 5:
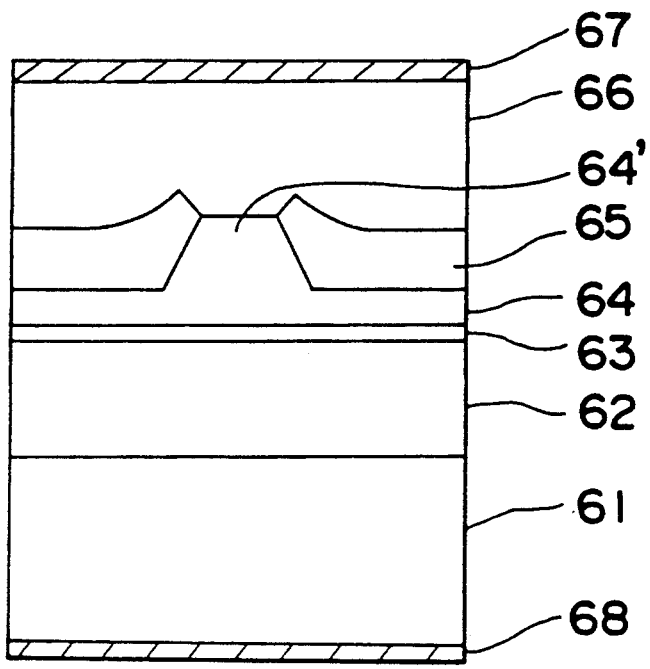
FIG. 5 is a schematic sectional view of a ridge type AlGaInP semiconductor laser.

FIG. 5 shows a ridge-type semiconductor laser schematically, which is manufactured as follows: First, in the first MOVPE growth, an n-Al$_{0.35}$Ga$_{0.15}$In$_{0.5}$P cladding layer 62 of thickness 0.7 μm, a GaInP active layer 63 of 0.06 μm and a p-Al$_{0.35}$Ga$_{0.15}$In$_{0.5}$P first cladding layer 64 of thickness 0.7 μm are formed on an n-type GaAs substrate 61 successively. The MOVPE growth is performed under a reduced pressure of 100 Torr at a growth temperature of 700° C. Selenium hydride (H$_2$Se) is used as the n-type dopant gas and dimethyl zinc is used as the p-type dopant gas, and they are used at the desired carrier concentration.

Next, the cladding layer 64 is etched to form a ridge 64'. Then, in the second MOVPE growth, an n-GaAs current blocking layer 65 of thickness 0.5 μm is formed on the cladding layer 64 except the top of the ridge 64'. When the current blocking layer 65 is grown, both H$_2$Se and dimethyl zinc are supplied at the same time, so that the carrier density in the n-GaAs layer 65 becomes 10$^{18}$ cm$^{−3}$. Then, in the second MOVPE growth, a p-GaAs contact layer 66 are layered over the whole surface. The growth conditions in the second MOVPE growth are the same as those in the first MOVPE growth. Finally, electrodes 67 and 68 are formed at the p side and at the n side, respectively.

In this embodiment, the n-GaAs current blocking layer 65 is grown by supplying the p-type dopant (DMZ) as well ad the n-type dopant (H$_2$Se) simultaneously so that the carrier concentration in the p-AlGaInP cladding layer 64 is not changed and the position of the pn junction does not move. Further, the diffusion of zinc of the p-type dopant from the cladding layer to the active layer is not accelerated and the disordering of the GaInP active layer 63 does not occur. Thus, this method is advantageous for improving the characteristics and the reproducibility of a ridge-type semiconductor laser.

The manufacturing method of the present invention can also be applied to a semiconductor laser of inversion type wherein the conduction types are inverted. For example, in a semiconductor laser shown in FIG. 5, the layers 61–66 may be composed of a p-type GaAs substrate, a p-$Al_{0.35}Ga_{0.15}In_{0.5}P$ cladding layer, a GaInP active layer, a n-$Al_{0.35}Ga_{0.15}In_{0.5}p$ first cladding layer, an p-GaAs current blocking layer and an n-GaAs contact layer. Then, the simultaneous doping is used when the n-$Al_{0.35}Ga_{0.15}In_{0.5}P$ first cladding layer is formed.

Figure 6:
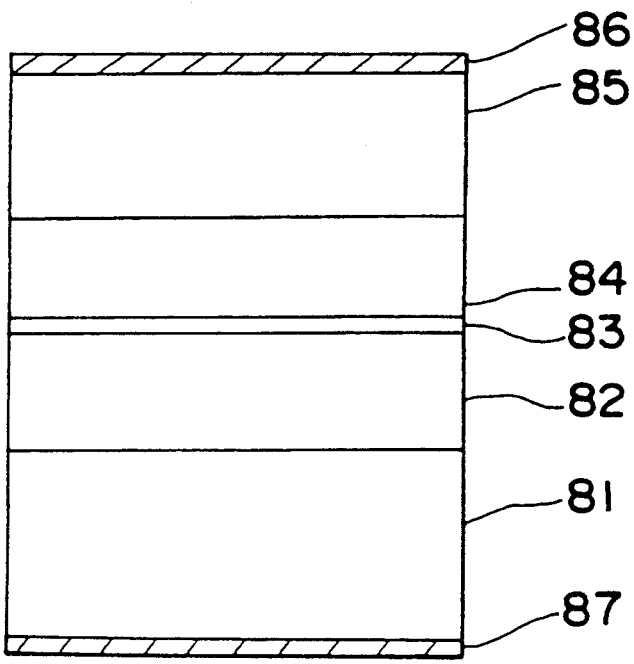
FIG. 6 is a schematic sectional view of a light-emitting diode.

FIG. 6 shows a light-emitting diode schematically, which is manufactured as follows: In the first epitaxial growth step with use of MOVPE, an n-AlGaInP layer 82 of thickness 3 $\mu$m, a GaInP active layer 83 of thickness 0.3 $\mu$m, a p-AlGaInP layer 84 of thickness 3 $\mu$m and a p-AlGaAs contact layer 55 of thickness 10 $\mu$m are layered on an n-GaAs substrate 81 successively. Next, electrodes 86 and 87 are formed a the P side and at the N side, respectively. The wavelength of emitted light is 660 $\mu$m.

When the p-AlGainP layer 84 is grown, both $H_2Se$ and dimethyl zinc are supplied at the same time. Therefore, the selenium atoms doped in the AlGaInP layer 84 do not diffuse into the active layer 83.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A manufacturing method of a semiconductor multi-layer on a substrate including a p-type semiconductor layer and an n-type semiconductor layer applied to the p-type semiconductor layer, comprising the steps of:
   forming an active layer on said substrate;
   forming the p-type semiconductor layer on said active layer by doping a p-type dopant;
   forming the n-type semiconductor layer on the p-type semiconductor layer by doping an n-type dopant and the p-type dopant simultaneously, the concentration of the n-type dopant in the n-type semiconductor layer being larger than that of the p-type dopant.

2. The manufacturing method according to claim 1, wherein said p-type semiconductor layer is made of p-AlGaInP and said n-type semiconductor layer is made of n-AlGaInP layer.

3. The manufacturing method according to claim 2, wherein said n-type dopant is selenium and said p-type dopant is zinc.

4. A manufacturing method of a semiconductor laser, comprising the steps of:
   forming an n-type first cladding layer;
   forming an active layer on said n-type first cladding layer;
   forming a p-type first cladding layer on said active layer;
   forming an n-type current blocking layer applied to the p-type first cladding layer except in a region for current passage by doping an n-type dopant and p-type dopant simultaneously; and
   forming a p-type second cladding layer and a contact layer applied successively to the p-type first cladding layer and to the n-type current blocking layer.

5. The manufacturing method according to claim 4, wherein said p-type second cladding layer is made of p-AlGaInP and said n-type current blocking layer is made of n-AlGaInP layer.

6. The manufacturing method according to claim 5, wherein said n-type dopant is selenium and said p-type dopant is zinc.

7. The manufacturing method according to claim 1, wherein said p-type dopant in said n-type semiconductor layer suppresses the diffusion of said n-type dopant in said n-type semiconductor layer into said p-type semiconductor layer and suppresses the diffusion of said p-type dopant in said p-type semiconductor layer to the n-type semiconductor layer;
   whereby the concentration profile of said p-type dopant changes sharply at the interface between said p-type and n-type semiconductor layers.

8. The manufacturing method according to claim 1, wherein said step of forming the n-type semiconductor layer uses a gas phase epitaxy process.

9. The manufacturing method according to claim 4, wherein said p-type dopant in said n-type current blocking layer suppresses the diffusion of said n-type dopant in said n-type semiconductor layer into said p-type first cladding layer and suppresses the diffusion of said p-type dopant in said p-type current blocking to said n-type current blocking layer;
   whereby the concentration profile of said p-type dopant changes sharply at the interface between said p-type first cladding layer and n-type current blocking layer.

10. The manufacturing method according to claim 4, wherein said step of forming the n-type current blocking layer uses a gas phase epitaxy process.

11. The manufacturing method of claim 1, wherein said n-type dopant and said p-type dopant are added to said n-type semiconductor layer during the formation of said n-type semiconductor layer.

12. The manufacturing method of claim 4, wherein said n-type dopant and said p-type dopant are added to aid n-type current blocking layer during the formation of said n-type current blocking layer.

13. A method of manufacturing a heterostructure semiconductor laser comprising:
   forming a first n-type cladding layer on a substrate;
   forming an active layer on said first n-type cladding layer;
   forming a first p-type cladding layer on said active layer;
   forming an n-type current blocking layer on said first p-type cladding layer, said formation of said n-type current blocking layer comprising the simultaneous doping of an n-type dopant and a p-type dopant into said n-type current blocking layer during the formation of said n-type current blocking layer;
   etching a portion of said n-type current blocking layer so as to expose said fist p-type cladding layer;
   forming a second p-type cladding layer on said n-type current blocking layer; and
   forming a contact layer of said second p-type cladding layer.

* * * * *

UNITED STATES PATENT AND TRADEMARK OFFICE
CERTIFICATE OF CORRECTION

PATENT NO. : 5,270,246
DATED : December 14, 1993
INVENTOR(S) : Masaya Mannou et al.

It is certified that error appears in the above-identified patent and that said Letters Patent is hereby corrected as shown below:

Column 1, Line 49: "abovementioned" should read --above-mentioned--.

Column 3, Line 37: "pAl0Al$_{0.35}$Ga$_{0.15}$In$_{0.5}$P" should read --Al$_{0.35}$Ga$_{0.15}$In$_{0.5}$P--.

Column 4, Line 1: "n-AllnP" should read --n-AlInP--.

Column 4, Line 63: "ad" should read --as--.

Column 5, Line 23: "a" should read --at--.

Column 5, Line 26: "p-AIGainP" should read --p-AlGaInP--.

Column 6, Line 46: "aid" should read --said--.

Signed and Sealed this

Twenty-first Day of February, 1995

Attest:

BRUCE LEHMAN

Attesting Officer

Commissioner of Patents and Trademarks